United States Patent [19]

Jeffers

[11] Patent Number: 5,258,722
[45] Date of Patent: Nov. 2, 1993

[54] AMPLIFIER CIRCUIT WITH DISTORTION CANCELLATION

[75] Inventor: Michael F. Jeffers, Flourtown, Pa.

[73] Assignee: General Instrument Corporation, Jerrold Comminications, Hatboro, Pa.

[21] Appl. No.: 806,484

[22] Filed: Dec. 13, 1991

[51] Int. Cl.$^5$ .............................................. H03F 1/30
[52] U.S. Cl. ..................................... 330/149; 328/163
[58] Field of Search ................ 330/151, 149; 328/163; 375/51; 455/50.1, 63; 381/94

[56] References Cited

U.S. PATENT DOCUMENTS

| | | | |
|---|---|---|---|
| 3,755,754 | 8/1973 | Putz | 330/149 |
| 3,886,470 | 5/1975 | O'Neil et al. | 330/149 |
| 4,472,725 | 9/1984 | Blumenkranz | 330/149 |
| 4,517,521 | 5/1985 | Preschutti et al. | 330/2 |
| 4,564,816 | 1/1986 | Kumar et al. | 330/149 |
| 4,617,522 | 10/1986 | Tarbutton et al. | 330/149 |
| 4,633,513 | 12/1986 | Taney | 455/131 |
| 4,677,390 | 6/1987 | Wagner | 330/149 |
| 4,782,307 | 11/1988 | Hsu | 330/151 |
| 4,792,751 | 12/1988 | Blumenkranz et al. | 324/57 N |
| 4,812,779 | 3/1989 | Wagner | 330/149 |
| 4,943,783 | 7/1990 | Nojima | 330/149 |
| 4,992,754 | 2/1991 | Blauvelt et al. | 330/149 |
| 5,015,965 | 5/1991 | Katz et al. | 330/149 |

*Primary Examiner*—Robert J. Pascal
*Assistant Examiner*—Tan Dinh
*Attorney, Agent, or Firm*—Marshall, O'Toole, Gerstein, Murray & Borun

[57] ABSTRACT

A circuit for amplifying an input signal includes an output amplifier that develops an output signal including distortion at a first magnitude and phase displacement when a signal of a second magnitude is applied thereto and a further amplifier wherein the amplifiers have substantially identical gains and distortion characteristics and are operated at substantially the same input and output levels. The further amplifier is included in a circuit responsive to the input signal wherein the circuit provides an intermediate signal to the output amplifier. The intermediate signal includes a first signal portion comprising a scaled version of the input signal and a second signal portion comprising distortion at substantially the first magnitude and at a phase displacement substantially 180° out of phase relative to the first phase displacement. The output amplifier amplifies the intermediate signal and distortion in the output signal is substantially canceled by application of the second portion of the intermediate signal to the output amplifier.

12 Claims, 4 Drawing Sheets

5,258,722

AMPLIFIER CIRCUIT WITH DISTORTION CANCELLATION

TECHNICAL FIELD

The present invention relates generally to amplifier circuits, and more particularly to amplifier circuits that develop reduced distortion in the output thereof.

BACKGROUND ART

Communication systems, such as CATV systems or local area networks (LAN's) often require the use of line extenders and distribution amplifiers, such as bridging amplifiers in trunk repeater stations. Such devices must amplify incoming signals with little or no distortion and deliver the resulting signals to one or more distribution cables at medium to high radio frequency output levels. Further, this goal must be achieved at the lowest possible cost. Prior attempts at designing broadband amplifiers meeting these requirements have utilized feed-forward techniques. For example, Wagner, U.S. Pat. Nos. 4,677,390 and 4,812,779 disclose a feed-forward amplifier wherein a sample of an input signal supplied to a main amplifier is compared with a sample of an output signal developed by the amplifier to produce an error signal proportional to the difference therebetween. The error signal is amplified and combined in opposite phase with the main amplifier signal to substantially cancel distortion and noise products generated by the main amplifier.

Other types of feed-forward amplifiers are disclosed in O'Neil, et al., U.S. Pat. No. 3,886,470, Preschutti, U.S. Pat. No. 4,517,521 and Hsu, U.S. Pat. No. 4,782,307.

Blauvelt, et al., U.S. Pat. No. 4,992,754 discloses an electronic circuit that provides a linear output from an amplitude modulated transmission device, such as a solid state laser having inherent distortion. The distortion of the laser is compensated by applying a predistorted signal equal in magnitude and opposite in sign to the distortion introduced by the laser. An input signal is split into first and second paths and a primary part of the input signal is applied via the first path to the laser with a time delay to compensate for delays in the second path. A predistorter in the second path generates predistortion at an amplitude that matches the amplitude of the distortion. A phase adjust circuit is provided in the second path to allow precise control of the phase of the predistorted signal. This patent also discloses that other nonlinear devices, such as amplifiers, may have inherent distortion largely canceled by the technique disclosed therein.

It has been found that conventional feed-forward circuits are useful to provide amplification with low distortion. However, such circuits have relatively complex designs. Also, when it is desired to distribute the input signal to multiple utilization devices, multiple feed-forward circuits must be used, in turn undesirably adding to the complexity and cost of the overall system.

SUMMARY OF THE INVENTION

In accordance with the present invention, amplifiers with similar distortion characteristics are utilized to reduce distortion to a significant degree in a simple and inexpensive manner.

More particularly, a circuit for amplifying an input signal includes an output amplifier that develops an output signal. The output signal generally has an undesirable distortion component. It is the object of the present invention to process the input signal so as to generate an intermediate signal that is predistorted to drive the output amplifier with a distortion component that is 180° out of phase with the distortion which is to be added by the output amplifier.

To obtain the predistorted signal, a first amplifier having substantially similar characteristics to the output amplifier is used to amplify the input signal. The output of the first amplifier is first shifted in phase by 180°, and then, twice the original signal, without distortion, is combined (summed) with the phase shifted output of this first amplifier. The resulting intermediate signal contains both the original input signal and the distortion component, but the phase relationship between the input signal and the distortion is shifted by 180°. Thus, the distortion of the output amplifier will be substantially canceled.

In another embodiment on the present invention, a plurality of output amplifiers are driven by the same predistorted intermediate signal. In such manner a single first amplifier, phase shifter and combiner device for processing the input signal to generate the predistorted intermediate signal may be shared among many output amplifiers.

The present invention permits amplification and distribution of an input signal without introducing substantial distortion therein. This desirable result is effected through the use of similar or substantially identical amplifiers together with passive components connected in a simple circuit configuration.

DESCRIPTION OF THE PREFERRED EMBODIMENTS

Figure 1:
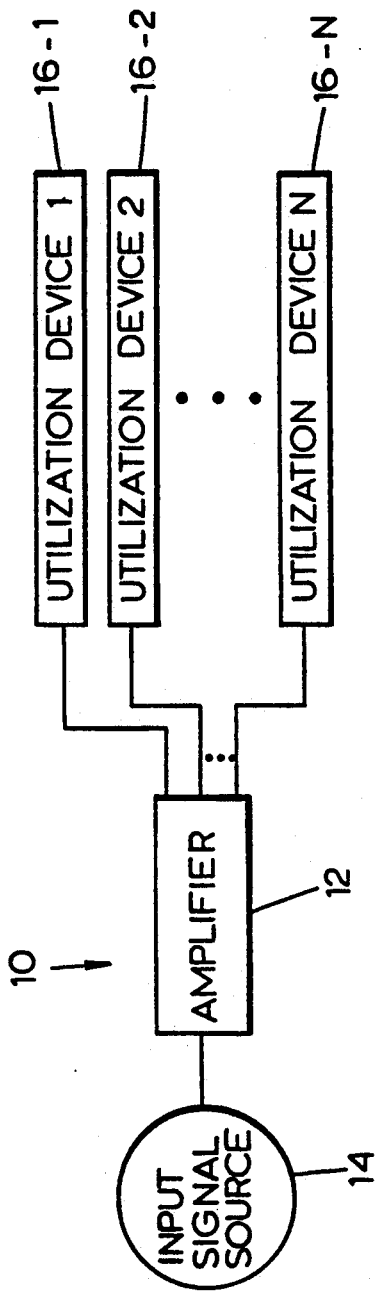
FIG. 1 is a block diagram illustrating a signal distribution system utilizing an amplifier according to the present invention.

Referring now to FIG. 1, a signal distribution system 10 includes an amplification circuit or system 12 that amplifies an input signal produced by an input signal source 14 and distributes the amplified signal to one or more utilization devices 16-1, 16-2 . . . 16-N. For example, the distribution system 10 may comprise a portion of a community antenna television (CATV) system, a local area network (LAN) or a different type of communication system.

Figure 2:
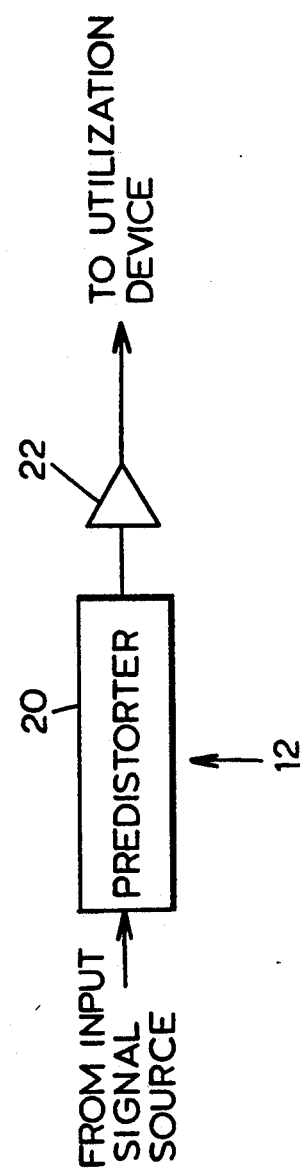
FIG. 2 is a block diagram showing the amplifier of FIG. 1.

Referring now to FIG. 2, the amplification system 12 includes a predistorter circuit 20 that receives the input signal from the input signal source. In the embodiment of FIG. 2, the predistorter circuit 20 develops an intermediate signal that is supplied to an output amplifier 22. The output amplifier 22 amplifies the intermediate signal to produce an output signal that is supplied to a utilization device. As noted in greater detail hereinafter, in the event that multiple utilization devices are to be supplied, additional output amplifiers are coupled to the output of the feed-forward circuit 20.

Figure 3:
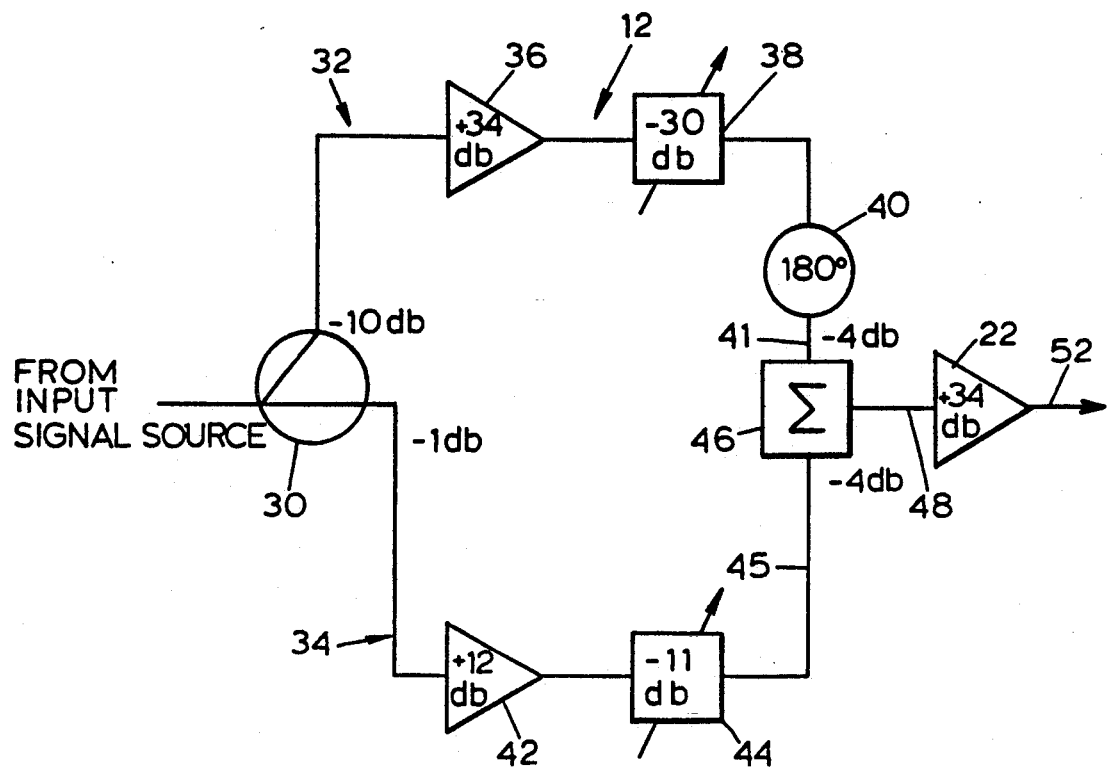
FIG. 3 is a combined schematic and block diagram of a first embodiment illustrating the present invention.

Referring now to FIG. 3, the amplification system 12 is illustrated in greater detail. A directional coupler 30 receives the input signal from the signal source 14 and splits the input signal into first and second paths 32, 34, respectively. The portion of the input signal supplied to the first path 32 is reduced in magnitude by a certain amount, such as 10 db, while the portion of the input signal supplied to the second path 34 is reduced by a second, different amount, such as 1 db. Connected in the first path 32 is a first intermediate amplifier 36, a variable attenuator 38 and a phase-shifter 40. Connected in the second path 34 is a second intermediate amplifier 42 and a further attenuator 44. The outputs of the phase-shifter 40 and the further attenuator 44 are coupled to a combiner 46, which may comprise, for example, a directional coupler. The combiner 46 introduces a 4 db attenuation in the signals supplied thereto and the resulting intermediate signal on a line 48 is amplified by the output amplifier 22 to produce the output signal on a line 52.

Several conditions apply to the circuit of FIG. 3. Preferably, the amplifiers 36 and 22 are substantially identical (within manufacturing tolerances and limits) and have substantially identical gains and distortion characteristics. Also, the signals supplied to the amplifiers 36 and 22 are at substantially the same level. Moreover, the length of the first path 32 and the length of the second path 34 are electrically equivalent over the bandwidth at which the circuit is operated.

Still further, the amplifier 42 has substantially the same flat response as the amplifiers 36 and 22; however, the amplifier 42 is operated at a substantially lower gain than the amplifiers 36 and 22 and produces substantially no distortion and has substantially no noise in the output thereof.

Under the foregoing conditions, and under the assumption that the input signal is at a level of, for example, 30 db above a particular reference, the input signal is split into the first path 32 and is attenuated by 10 db to produce a signal at 20 db. This signal is amplified by the first amplifier 36 and attenuated by the attenuator 38 to produce a signal at 24 db. This signal includes a main portion at a first magnitude comprising a scaled version of the input signal together with distortion. This signal is shifted 180° by the phase-shifter 40 to produce a first component signal $S_1$ on line 41 as follows:

$$S_1 = -(L_1 + d_1) \quad (1)$$

where $L_1$ comprises the main portion and $d_1$ comprises the distortion referred to above. It should be noted that the phase-shifter 40 is a broadband device that does not introduce substantial attenuation or distortion of the signal developed at the output of the attenuator 38. The phase shifter 40 may comprise a transformer or a passive or active signal inverting element. Further, the attenuator 38 provides variable attenuation to permit fine tuning of the signal amplitude at the input of the phase shifter 40 so that distortion cancellation is optimized.

The input signal is split by the directional coupler 30 into the second path 34 with a 1 db loss. This second path signal is amplified by the amplifier 42, which has a gain, for example, of 12 db. The resulting signal is attenuated by the attenuator 44, which is similar to the attenuator 38 in that it may be variable in nature. The resulting second component signal on line 45 includes a main portion having a second magnitude substantially twice the first magnitude and substantially no distortion:

$$S_2 = 2L_1 \quad (2)$$

The first and second component signals are attenuated by equal amounts (4 db in the illustrated example) and are combined by the combiner 46 to produce the intermediate signal (designated $S_3$) as follows:

$$S_3 = S_1 + S_2 = -(L_1 + d_1) + 2L_1 = L_1 - d_1 \quad (3)$$

The intermediate signal $S_3$ on the line 48 thus includes a main portion $L_1$ substantially identical to the signal provided to the first amplifier 36 together with a distortion portion $d_1$ introduced by the amplifier 36 that is phase shifted 180° by the phase-shifter 40. The amplifier 22 amplifies the intermediate signal $S_3$ on the line 48 to produce the output signal as follows:

$$\text{OUTPUT SIGNAL} = AL_1 + d_1 - d_1 = AL_1 \quad (4)$$

where A is the gain of the amplifier 22 and is, in the illustrated embodiment, equal to 34 db as noted previously. It should be noted that the distortion portion $-d_1$, while amplified by the gain of the amplifier 22, is at such a low level that the effect of such gain causes negligible additional distortion, and hence cancellation of the distortion otherwise introduced by the amplifier 22 is accomplished.

As the foregoing discussion illustrates, the amplifiers 36 and 22 receive signals having substantially the same magnitude, with the exception that the amplifier 22 receives a distortion portion that substantially cancels distortion generated in the amplifier 22.

Figure 4:
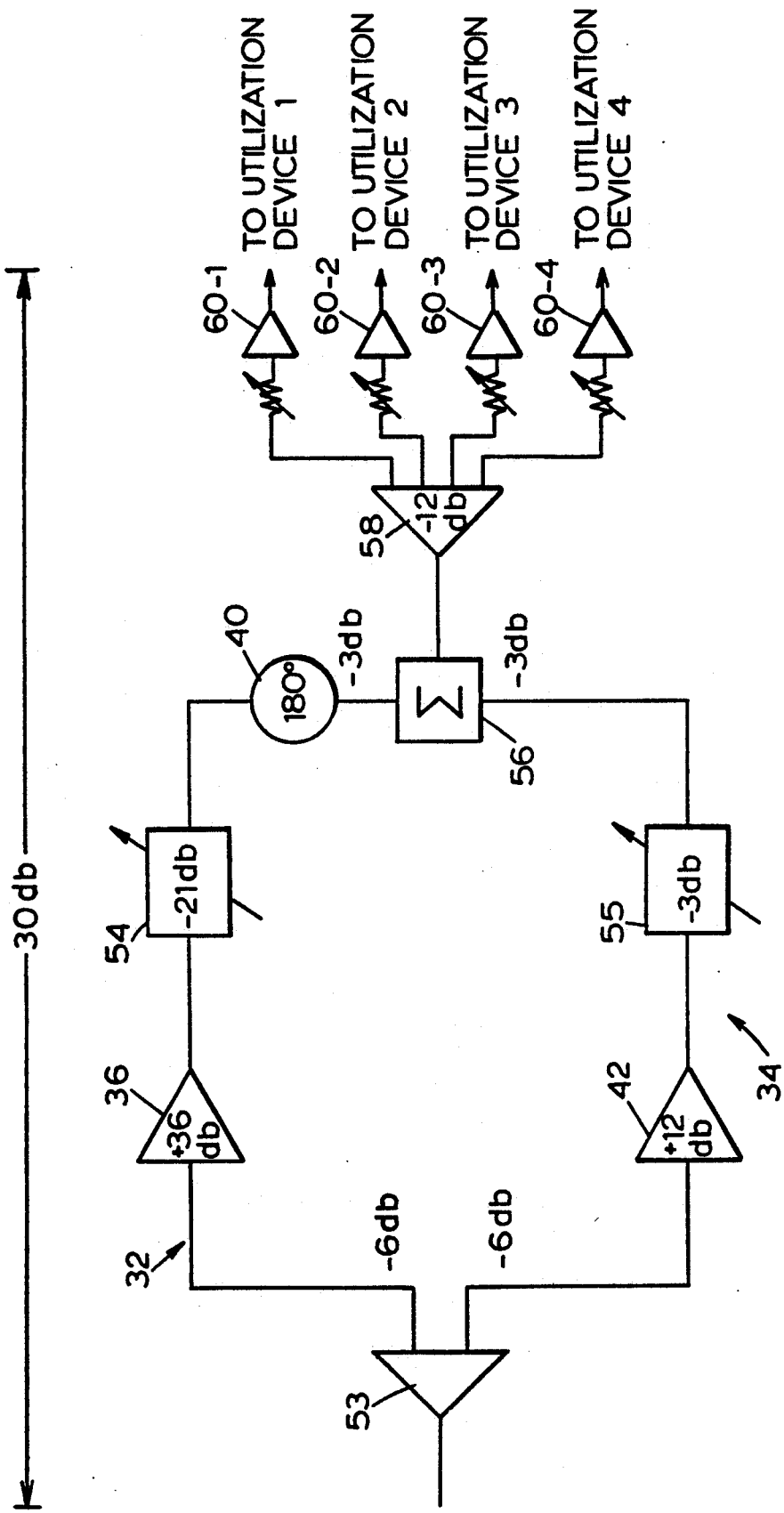

FIG. 4 illustrates a modification of the embodiment of FIG. 3 wherein like elements are assigned like reference numerals. In this embodiment, the directional coupler 30 is replaced by a resistive splitter 53 that introduces a 6 db attenuation into the first and second path signals (as compared to the input signal). In addition, the attenuators 38, 44 are replaced by attenuators 54, 55 that have attenuation factors of 21 db and 3 db, respectively. Again, the attenuators 54 and 55 may be variable to permit optimization of distortion cancellation. Further, the combiner 46 is replaced by a combiner 56 wherein an attenuation of 3 db is introduced into the signals supplied thereto.

Coupled to the output of the combiner 56 is a resistive splitter 58 that introduces a 12 db attenuation in each of the output signals therefrom. Coupled to the splitter 58 is a series of output amplifiers 60-1 through 60-4 that in turn supply utilization devices. The output amplifiers 60-1 through 60-4 receive substantially identical signals developed by the splitter 58 and attenuators 59-1 through 59-4 and have gains and distortion characteristics identical to the gain and distortion characteristics of the amplifier 36, except that each amplifier 60-1 through 60-4 has a relatively small variable gain range of 0–3 db to permit limited adjustment of the signal amplitudes developed by the amplifiers 60-1 through 60-4. As was the case with the embodiment of FIG. 3, the amplifier 42 has a gain substantially less than the gain of the amplifier 36 and develops substantially no distortion. The signal produced by the combiner 56 is obtained by summing the signals flowing in the first and second paths wherein the magnitude of the main portion of the second component signal produced at the output of the attenuator 55 is substantially equal to twice the magnitude of the main portion of the first component signal developed at the output of the phase-shifter 40. The combiner 56 thus develops a signal including a main portion and a distortion portion. However, the main portion and distortion portion magnitudes are 12 db greater than the magnitudes of the signal portions supplied to the amplifier 36 in the embodiment of FIG. 3. As before, the distortion portion of the signal supplied to the splitter 58 is phase shifted 180° relative to the distortion produced by the amplifier 36. After splitting by the splitter 58, each of the signals supplied to the output amplifiers 60-1 through 60-4 has a magnitude equal to the magnitude of the signal delivered to the amplifier 36 and a distortion portion that cancels distortion produced by each amplifier 60-1 through 60-4.

It can thus be seen that the embodiment of FIG. 4 is capable of canceling distortion in the outputs of multiple output amplifiers using a single feed-forward circuit to effectuate this result. This highly desirable advantage results in an overall simplification of the system and a reduction in cost thereof.

Figure 5:
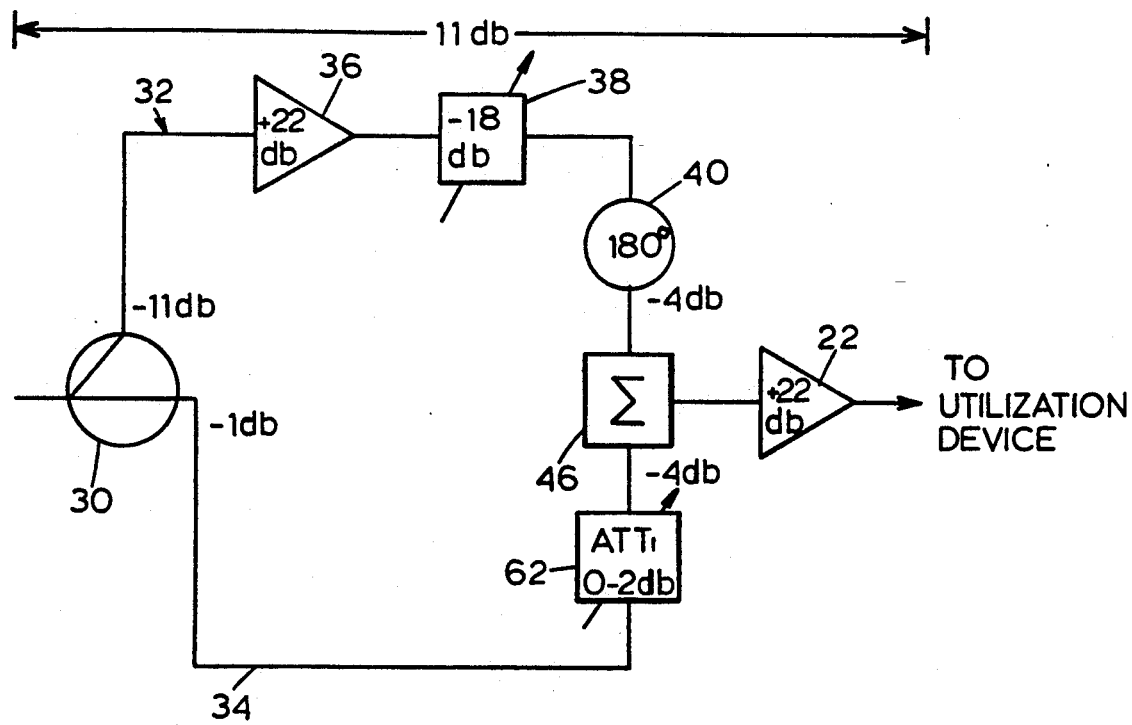
FIGS. 4–6 are combined schematic and block diagrams similar to FIG. 3 illustrating further embodiments of the present invention.

FIG. 5 illustrates yet another alternative embodiment of the present invention. Elements common to FIGS. 3 and 5 are assigned like reference numerals. The embodiment of FIG. 5 chiefly differs from that of FIG. 3 in that no amplifier is used in the second path 34. Further, the gains of the amplifiers 36 and 32 are changed to 22 db and the attenuation factor of the variable attenuator 38 is changed to 18 db. Also, an additional variable attenuator 62 providing between 0 and 2 db of attenuation is used in the second path 34 and a directional coupler 30 is utilized having an 11 db/1 db attenuation split between the first and second paths, respectively. The first component signal produced by the amplifier 36, the attenuator 38 and the phase shifter 40 is combined by the combiner 46 with the signal flowing in the second path to produce an intermediate signal. As was noted in connection with the previous embodiments, distortion in the output signal produced by the amplifier 22 is canceled by a distortion portion in the intermediate signal. The variable attenuators 38 and 62 are adjusted to obtain optimized distortion cancellation in the output signal.

Figure 6:
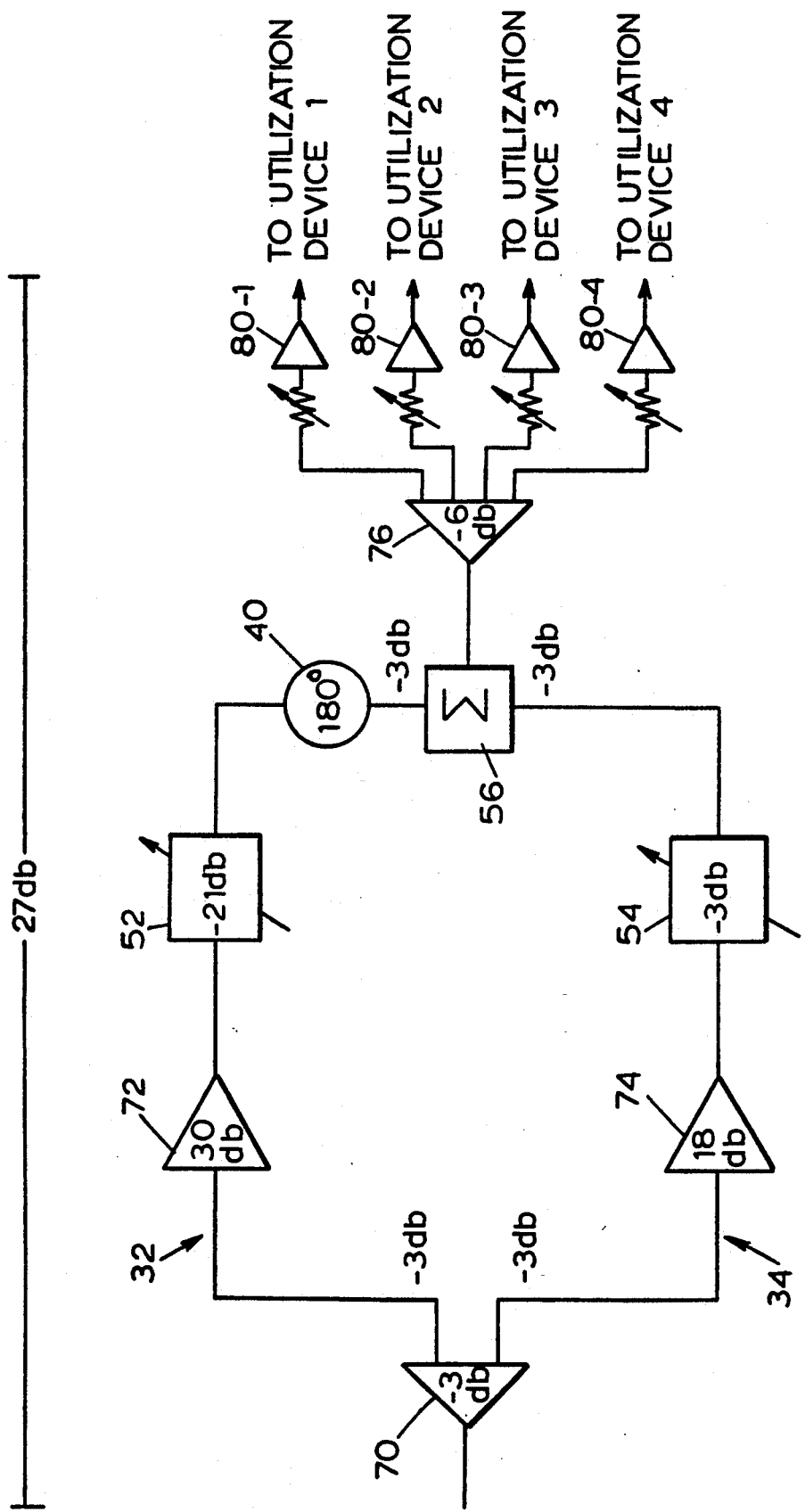

FIG. 6 illustrates yet another alternative embodiment of the invention that comprises a modification of the embodiment of FIG. 4. In this embodiment, the splitter 50 is replaced by a splitter 70 that imparts a 3 db attenuation to the first and second path signals relative to the input signal. In addition, the amplifier 36 is replaced by an amplifier 72 having a gain of 30 db and the amplifier 42 is replaced by an amplifier 74 having a gain of 18 db. Still further, the resistive splitter 58 is replaced by a resistive splitter 76, which splits the intermediate signal developed by the combiner 56 into four signals and which introduces a 6 db loss into each. The amplifiers 60-1 through 60-4 are replaced by amplifiers 80-1 through 80-4, each of which has substantially identical gain and distortion characteristics as the amplifier 72. Like the amplifiers 60-1 through 60-4, each amplifier 80-1 through 80-4 has a relatively small (i.e. 0-3 db) gain range to permit limited adjustment of the output signal amplitudes. The embodiment of FIG. 6 is particularly useful where efficient power splitters can be used as the splitters 70 and 76 and still maintain accurate amplitude and phase. As can be seen by an inspection of FIG. 6, the overall gain of the circuit is 27 db.

It should be understood that the various gains, attenuation factors and the like are merely exemplary in the sense that other gains and attenuation factors may be used, provided that the first intermediate amplifiers (36 and 72) and the respective output amplifiers (22, 60 and 80) have substantially the same gain and provided that the magnitude of the main portion of the first component signal is substantially one-half of the magnitude of the main portion of the signals supplied by the second path to the combiner 46.

The present invention achieves distortion cancellation without the insertion losses encountered in a typical feed-forward circuit caused by the use of directional couplers downstream of the output amplifier.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

I claim:

1. A circuit for amplifying an input signal, comprising:
    an output amplifier that develops an output signal including distortion at a first magnitude and phase displacement when a signal of second magnitude is applied thereto;
    splitting means for splitting the input signal into first and second path signals;
    first converting means coupled to the splitting means for converting the first path signal into a first component signal having a main portion at a third magnitude and distortion at the first magnitude;
    second converting means coupled to the splitting means for converting the second path signal into a second component signal having a main portion at a fourth magnitude substantially twice the third magnitude and distortion at substantially zero magnitude;
    means for combining the first and second component signals to obtain an intermediate signal wherein the intermediate signal is provided to the output amplifier and includes a first signal portion comprising a scaled version of the input signal and a second signal portion comprising distortion at substantially the first magnitude and at a phase displacement substantially 180° out of phase relative to the first phase displacement;
    whereby the output amplifier amplifies the intermediate signal and whereby distortion in the output signal is reduced by application of the second portion of the intermediate signal to the output amplifier.

2. The circuit of claim 1, wherein the first converting means comprises a first intermediate amplifier coupled to the splitting means and a phase-shifter coupled to the first intermediate amplifier for phase shifting a signal produced by the intermediate amplifier by 180° and wherein the first intermediate amplifier and the output amplifier have substantially identical gains and distortion characteristics.

3. The circuit of claim 2, wherein the second converting means comprises a second intermediate amplifier coupled to the splitting means having a gain substantially less than the gain of the first intermediate amplifier.

4. The circuit of claim 1, further including a plurality of additional output amplifiers and further including applying means for applying each of a plurality of additional intermediate signals to one of the plurality of additional output amplifiers, each of the plurality of additional intermediate signals being identical to the first-named intermediate signal.

5. The circuit of claim 1, wherein each of the splitting means and the applying means comprises a resistive splitter.

6. A circuit for amplifying an input signal, comprising:
   an output amplifier that develops an output signal including distortion at a first magnitude and phase displacement when a signal of second magnitude is applied thereto;
   splitting means for splitting the input signal into first and second path signals;
   converting means coupled to the splitting means for converting the first path signal into a first component signal having a main portion at a third magnitude and distortion at the first magnitude;
   wherein the second path signal has a main portion at a fourth magnitude substantially twice the third magnitude and distortion at substantially zero magnitude;
   means for combining the first component signal and the second path signal to obtain an intermediate signal wherein the intermediate signal is provided to the output amplifier and includes a first signal portion comprising a scaled version of the input signal and a second signal portion comprising distortion at substantially the first magnitude and at a phase displacement substantially 180° out of phase relative to the first phase displacement;
   whereby the output amplifier amplifies the intermediate signal and whereby distortion in the output signal is reduced by application of the second portion of the intermediate signal to the output amplifier.

7. The circuit of claim 6, wherein the converting means comprises an intermediate amplifier coupled to the splitting means and a phase-shifter coupled to the intermediate amplifier for phase shifting a signal produced by the intermediate amplifier by 180° and wherein the intermediate amplifier and the output amplifier have substantially identical gains and distortion characteristics.

8. A circuit for use with an output amplifier having a first gain and a certain distortion characteristic wherein the circuit is responsive to an input signal at a particular magnitude to develop an intermediate signal, comprising:
   a splitter for splitting the input signal into first and second path signals in first and second paths, respectively;
   a first amplifier coupled to the splitter for amplifying the first path signal, the first amplifier having a gain and distortion characteristic substantially equal to the first gain and the certain distortion characteristic, respectively, and producing an amplified first path signal including a main portion and distortion each of which has a magnitude;
   a second amplifier coupled to the splitter for amplifying the second path signal, the second amplifier having a second gain less than the first gain and producing an amplified second path signal including a main portion having a magnitude and substantially no distortion;
   adjusting means for adjusting the magnitudes of the portions of the amplified first and second path signals to obtain amplified and adjusted first and second path signals wherein the magnitude of the main portion of the amplified and adjusted second path signal is twice the magnitude of the main portion of the amplified and adjusted first path signal and such main portions are in phase with each other;
   phase shifting means coupled to the adjusting means for phase shifting the amplified and adjusted first path signal 180° to obtain a phase-shifted first path signal; and
   combining means coupled to the phase shifting means and the adjusting means for combining the phase-shifted first path signal and the amplified and adjusted second path signal to develop the intermediate signal.

9. The circuit of claim 8, further including a second splitter for splitting the intermediate signal into N output paths and further in combination with N output amplifiers connected in the N output paths wherein each of the output amplifiers has the first gain and the certain distortion characteristic.

10. The circuit of claim 9, wherein the first and second splitters are resistive devices.

11. The circuit of claim 9, wherein the first and second splitters are active devices.

12. The circuit of claim 8, wherein the adjusting means comprises first and second attenuators coupled in the first and second paths, respectively.

* * * * *